(12) United States Patent
Kim

(10) Patent No.: US 7,259,053 B2
(45) Date of Patent: Aug. 21, 2007

(54) METHODS FOR FORMING A DEVICE ISOLATION STRUCTURE IN A SEMICONDUCTOR DEVICE

(75) Inventor: Hak Dong Kim, Suwon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 280 days.

(21) Appl. No.: 10/946,717

(22) Filed: Sep. 22, 2004

(65) Prior Publication Data

US 2005/0064651 A1    Mar. 24, 2005

(30) Foreign Application Priority Data

Sep. 22, 2003  (KR) .................... 10-2003-0065626
Oct. 16, 2003  (KR) .................... 10-2003-0072111

(51) Int. Cl.
*H01L 21/8238* (2006.01)
*H01L 21/76* (2006.01)

(52) U.S. Cl. .................... 438/218; 438/231; 438/423

(58) Field of Classification Search ............... 438/218, 438/231, 423, 220, 440, 425, 453, 433, 225, 438/221, 448

See application file for complete search history.

(56) References Cited

U.S. PATENT DOCUMENTS

| | | | |
|---|---|---|---|
| 4,160,987 A * | 7/1979 | Dennard et al. ............ 257/296 |
| 5,134,085 A * | 7/1992 | Gilgen et al. ............... 438/210 |
| 5,182,226 A * | 1/1993 | Jang ............................ 438/297 |
| 5,612,249 A | 3/1997 | Sun et al. |
| 5,712,173 A * | 1/1998 | Liu et al. .................... 438/297 |
| 5,733,813 A * | 3/1998 | Chen et al. ................. 438/440 |
| 5,789,780 A * | 8/1998 | Fulford et al. ............. 257/344 |
| 5,880,008 A * | 3/1999 | Akiyama et al. ........... 438/444 |
| 5,891,265 A * | 4/1999 | Nakai et al. ................ 148/33.3 |
| 5,895,252 A * | 4/1999 | Lur et al. .................... 438/423 |
| 5,927,992 A * | 7/1999 | Hodges et al. ............. 438/439 |

(Continued)

FOREIGN PATENT DOCUMENTS

JP    2-35710    * 2/1990

(Continued)

OTHER PUBLICATIONS

Wolf, S.; Silicon Processing for the VLSI Era, vol. 2—Process Integration; Sunset Beach, CA: Lattice Press; 1990, pp. 387-389.*

*Primary Examiner*—M. Wilczewski
(74) *Attorney, Agent, or Firm*—Saliwanchik, Lloyd & Saliwanchik

(57) ABSTRACT

Methods of forming a device isolation structure in a semiconductor device are disclosed. A disclosed method comprises forming a p-type well and an n-type well in a semiconductor substrate; sequentially depositing a gate insulating layer and a gate electrode material layer; depositing a protective layer on the gate electrode material layer; removing a portion of the protective layer, a portion of the gate electrode material layer, and a portion of the gate insulating layer to expose a surface area of the semiconductor substrate; performing ion implantation and heat treatment processes to form a device isolation structure; forming a gate electrode by removing a portion of the gate electrode material layer; forming an LDD region by implanting low concentration impurity ions in the semiconductor substrate; forming a spacers on a sidewall of the gate electrode; and forming a source/drain region by implanting high concentration impurity ions.

8 Claims, 14 Drawing Sheets

U.S. PATENT DOCUMENTS

| | | | |
|---|---|---|---|
| 5,953,604 A * | 9/1999 | Lien | 438/217 |
| 5,976,952 A * | 11/1999 | Gardner et al. | 438/440 |
| 5,998,277 A * | 12/1999 | Wu | 438/407 |
| 6,001,709 A * | 12/1999 | Chuang et al. | 438/440 |
| 6,004,854 A * | 12/1999 | Dennison et al. | 438/306 |
| 6,020,232 A * | 2/2000 | Gardner et al. | 438/231 |
| 6,054,344 A * | 4/2000 | Liang et al. | 438/223 |
| 6,074,904 A * | 6/2000 | Spikes et al. | 438/223 |
| 6,090,689 A * | 7/2000 | Sadana et al. | 438/480 |
| 6,103,559 A * | 8/2000 | Gardner et al. | 438/183 |
| 6,127,242 A * | 10/2000 | Batra et al. | 438/440 |
| 6,153,481 A | 11/2000 | Jang et al. | |
| 6,235,607 B1 * | 5/2001 | Ibok | 438/407 |
| 6,309,936 B1 * | 10/2001 | Gardner et al. | 438/305 |
| 6,333,243 B1 * | 12/2001 | Thakur et al. | 438/440 |
| 6,429,099 B1 * | 8/2002 | Christensen et al. | 438/480 |
| 6,489,661 B2 | 12/2002 | Sekikawa et al. | |
| 6,583,000 B1 * | 6/2003 | Hsu et al. | 438/222 |
| 2001/0026990 A1 * | 10/2001 | Christensen et al. | 438/407 |
| 2003/0022461 A1 * | 1/2003 | Yang et al. | 438/439 |
| 2004/0087103 A1 * | 5/2004 | Kanamori | 438/423 |

FOREIGN PATENT DOCUMENTS

| | | | |
|---|---|---|---|
| JP | 3-246957 | * 11/1991 | |

* cited by examiner

METHODS FOR FORMING A DEVICE ISOLATION STRUCTURE IN A SEMICONDUCTOR DEVICE

The present disclosure relates to semiconductor fabrication, and more particularly, to methods for forming a device isolation structure in a semiconductor device.

BACKGROUND

A LOCOS (local oxidation of silicon) process has been developed and widely used as a semiconductor device isolation technology. As the LOCOS process has generally been used, new device isolation technologies have been developed to address shortcomings of the LOCOS process. For example, PBL (poly buffer LOCOS) and R-LOCOS (Recessed LOCOS) are widely used. However, these technologies have shortcomings in the context of high-integration of semiconductor devices. For instance, they are complicated processes and cannot fundamentally overcome problems such as bird's beak, which is produced as a result of the lifting of the edges of a nitride layer during subsequent oxidation. Moreover, a planarization process must be carried out after the completion of the LOCOS process because of the level difference between active regions and field regions.

To address the problems of the conventional device isolation technologies, a shallow trench isolation (hereinafter referred to as "STI") process has been developed. The STI process achieves good device isolation characteristics and is suitable for the high-integration of semiconductor devices because the STI structure occupies a small area.

A prior art STI process comprises: forming a trench within a field region of a semiconductor substrate, filling the trench with an oxide layer through a gap filling process, and planarizing the resulting semiconductor substrate by using a chemical mechanical polishing (hereinafter referred to as "CMP") process. The oxide layer to gap-fill the trench is preferably an $O_3$-TEOS (tetra-ethyl-ortho-silicate) layer formed by using APCVD (atmospheric pressure chemical vapor deposition). The oxide layer may be created by HDP CVD (high density plasma chemical vapor deposition).

Sekikawa et al., U.S. Pat. No. 6,489,661, describes a method of forming an element isolation film using LOCOS technology. The Sekikawa et al. Patent uses a pad oxidation film and a pad poly-Si film as an underlying buffer layer of an oxidation resisting film. The pad oxidation film and the pad poly-Si film are used as a gate oxide film and a part of a gate electrode to relax a level difference between the gate electrode and the wiring on the element isolation film.

Jang et al., U.S. Pat. No. 6,153,481, describes a method of forming an element isolation insulating film of a semiconductor device by employing a PBL method to reduce the bird's beak and to increase the length of the effective active region. The Jang et al. Patent comprises: sequentially forming a pad-oxide film, a stack-silicon film, and a nitride film on a semiconductor substrate; forming an element isolation region by selectively patterning the nitride film with an etching process by using an element isolation mask; and forming an element isolation film by field-oxidizing the element isolation region over the semiconductor substrate.

Sun et al., U.S. Pat. No. 5,612,249, describes a method of defining a LOCOS field isolation process after a poly gate is deposited. The Sun et al. Patent comprises: growing a gate oxide on a silicon substrate; depositing poly or amorphous silicon, depositing a thin layer of PECVD or LPCVD oxide on the poly or amorphous silicon, depositing LPCVD nitride as a hard mask, and defining a device active area by using a photoresist mask and performing a plasma etch.

FIGS. 1a and 1b are cross-sectional views illustrating a conventional STI process. Referring to FIG. 1a, a sacrificial layer is formed over the entire surface of a semiconductor substrate 101. The sacrificial layer preferably consists of an oxide layer 102 and a nitride layer 103. At least one opening is formed through the nitride layer 103 and the oxide layer 102 on a field region of the semiconductor substrate 101 by performing a photolithography process. At least one trench is then formed within the field region of the semiconductor substrate 101 by using the nitride layer 103 as an etching mask. An oxide layer 104 is grown along the sidewalls and bottom of the trench(es) 105. The trench(es) are then filled with an insulating layer 105 having good gap-fill characteristics. The insulating layer 105 may be, for example, oxide. Next, a planarization process is performed on the resulting structure.

Referring to FIG. 1b, the nitride layer 103 is etched by a phosphoric acid solution to expose the oxide layer 102. The oxide layer 102 is then etched by an HF solution to expose the surface of the active region of the semiconductor substrate 101. This completes the STI process.

The conventional STI process of FIGS. 1a-1b must remove some portion(s) of the insulating layer 105 through an etching process in order to lower the insulating layer 105 in height compared to the nitride layer 103 after the completion of the planarization process. During this process, the area of the insulating layer 105 which is in contact with the nitride layer 103 is etched more rapidly than the other parts of the insulating layer 105. Thus, after the nitride layer 103 and the oxide layer 102 are etched to expose the surface of the active region of the semiconductor substrate 101, as shown in FIG. 1b, a divot 106 on the upper edge of the trench is deepened. The deepened divot 106 may increase leakage current on the upper edge of the trench.

The above-described STI process may also increase costs as compared to the existing LOCOS process due to the complicated process and the change of the process margin due to the CMP process.

DETAILED DESCRIPTION

Figure 1A:
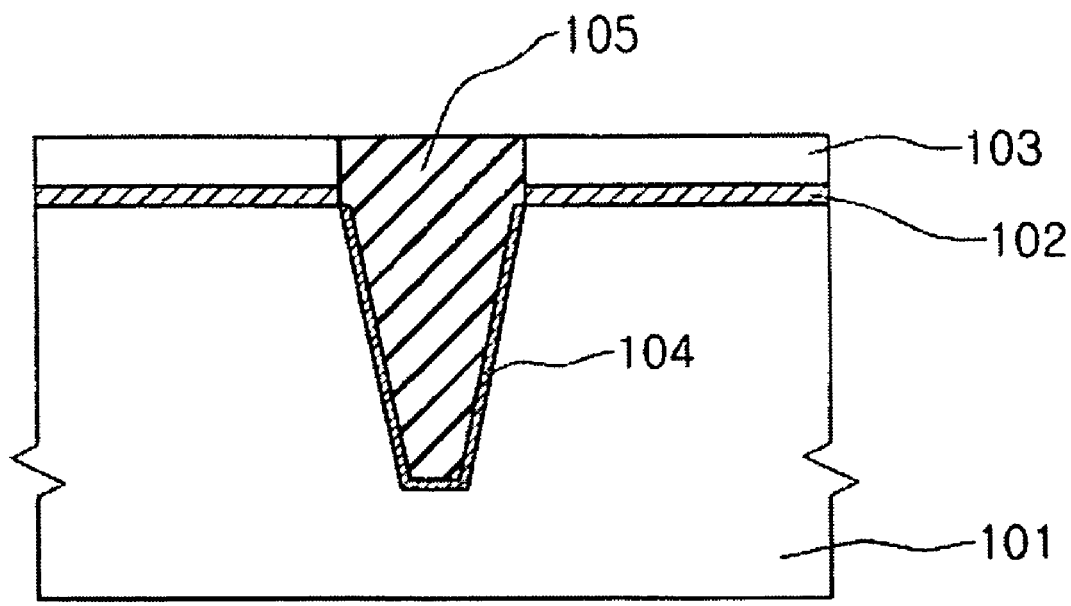
FIGS. 1a and 1b are cross-sectional views illustrating a conventional STI process.
Figure 1B:
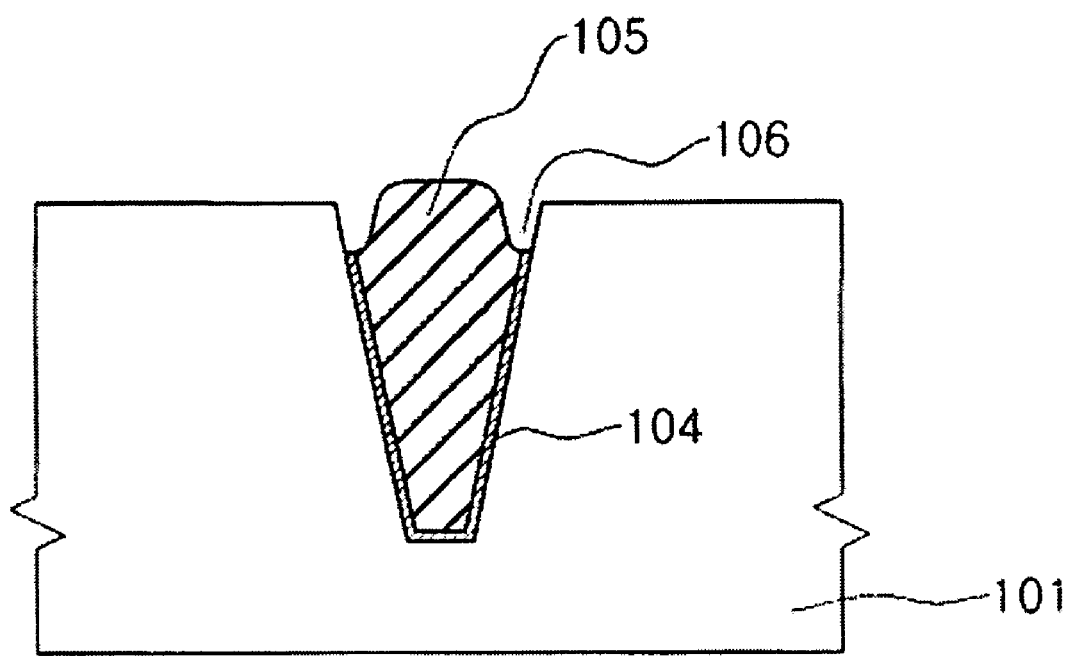
Figure 2A:
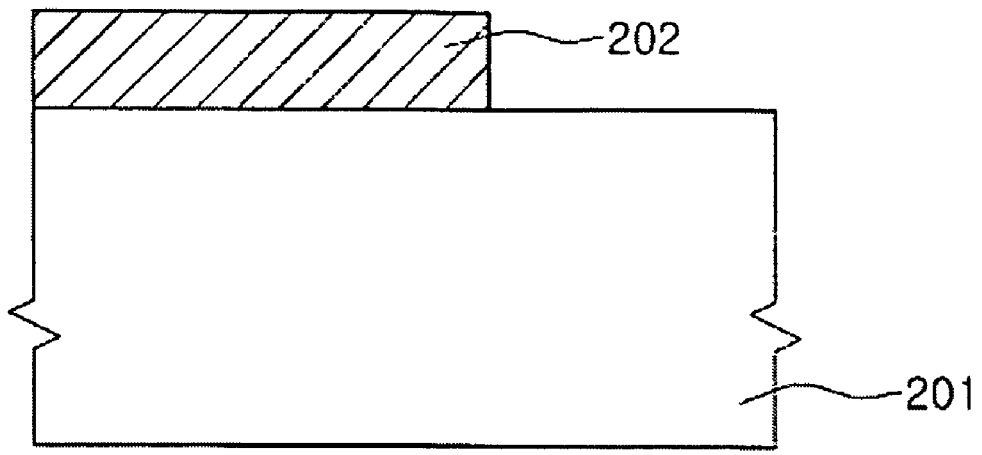
FIGS. 2a through 2k are cross-sectional views illustrating an example process of forming a device isolation structure of a semiconductor device performed in accordance with the teachings of the present invention.
Figure 2B:
Figure 2B:
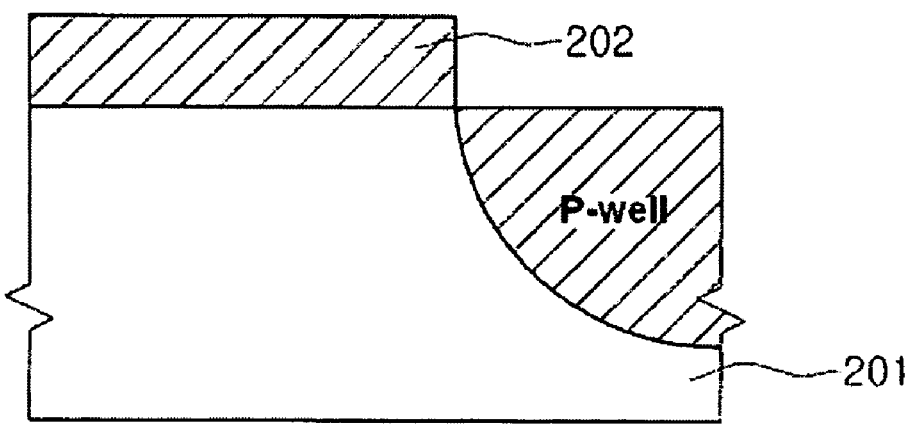
Figure 2C:
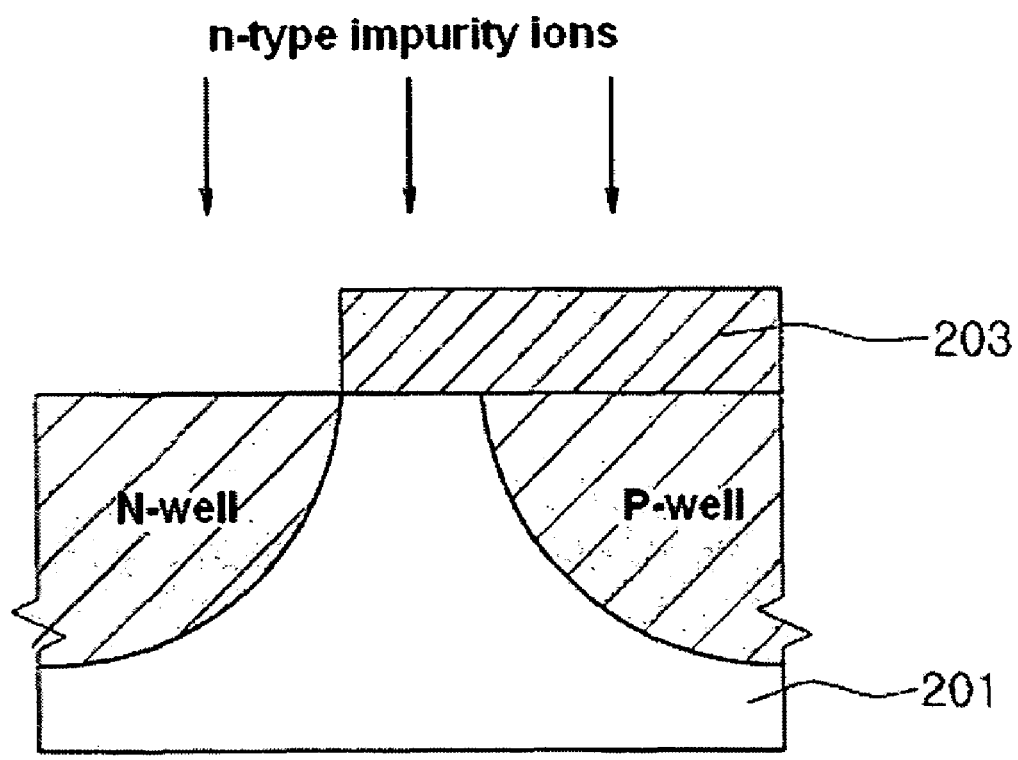

FIGS. 2a through 2k are cross-sectional views illustrating an example process of forming a device isolation structure. FIGS. 2a through 2c illustrate a well formation stage in fabricating a CMOS (Complementary Metal Oxide Semiconductor). Referring to FIG. 2a, to form a p-type well in a semiconductor substrate 201 with a first or second conduction type, a first ion implantation mask 202 is formed on the semiconductor substrate 201 using photoresist. In the illustrated example, the first ion implantation mask 202 exposes an area on which the p-type well will be formed. Referring to FIG. 2b, a p-type ion implantation process is performed on the semiconductor substrate 201 to make a p-type ion implant layer in the semiconductor substrate 201.

Referring to FIG. 2c, the first ion implantation mask 202 is removed and a second ion implantation mask 203 is formed on the semiconductor substrate 201 using photoresist. In the illustrated example, the second ion implantation mask 203 exposes an area on which an n-type well will be formed. Next, an n-type ion implantation process is performed on the semiconductor substrate 201 to make an n-type ion implant layer in the semiconductor substrate 201. Next, a heat treatment process is performed on the resulting structure to diffuse the ions in the p-type and n-type ion implant layers to thereby form p-type and n-type wells. The n-type well is formed at a predetermined distance from the p-type well so that a device isolation layer can be formed between the p-type well and the n-type well.

Figure 2D:
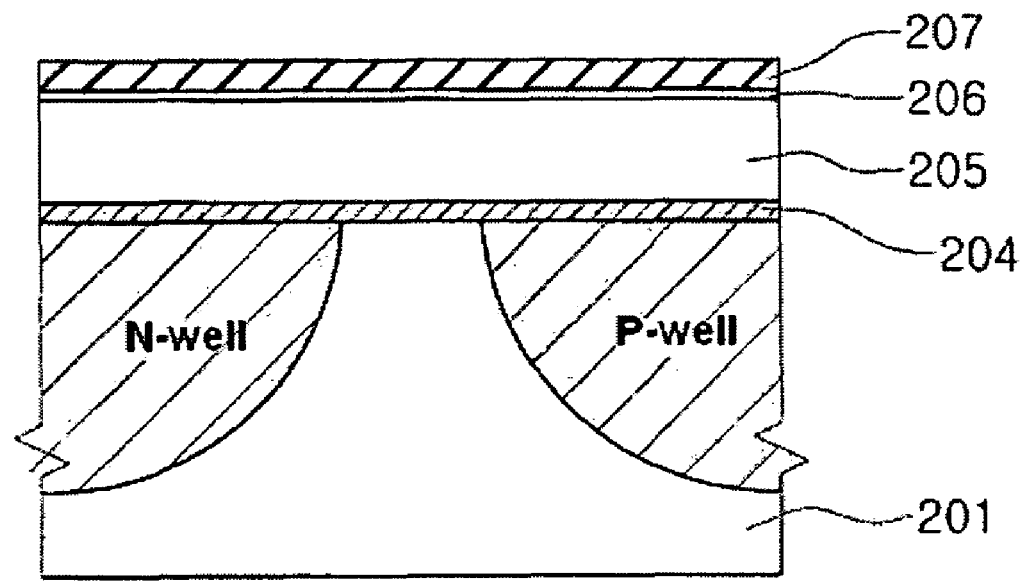

Referring to FIG. 2d, a gate insulating layer 204 is formed over the entire semiconductor substrate 201 by performing a thermal oxidation process on the semiconductor substrate 201. The gate insulating layer 204 preferably has a thickness between about 20 Å and about 50 Å. Next, a material to form a gate electrode, (for example, a polysilicon layer 205) is deposited over the entire gate insulating layer 204 by using a chemical vapor deposition (hereinafter referred to as "CVD") process. The polysilicon layer 205 preferably has a thickness between about 1500 Å and about 3000 Å. A protective layer, which prevents ions from infiltrating into the polysilicon layer 205, is then deposited on the polysilicon layer 205. The protective layer preferably consists of an oxide layer 206 and a nitride layer 207. The oxide layer 206 is formed by heat-treating the structure and has a thickness between about 30 Å and about 100 Å. The nitride layer 207 is deposited on the oxide layer 206 and has a thickness between about 100 Å and about 500 Å. The nitride layer 207 prevents the oxygen ions to be implanted during a later ion implantation process from penetrating into the polysilicon layer 205 under the oxide layer 206.

Figure 2E:
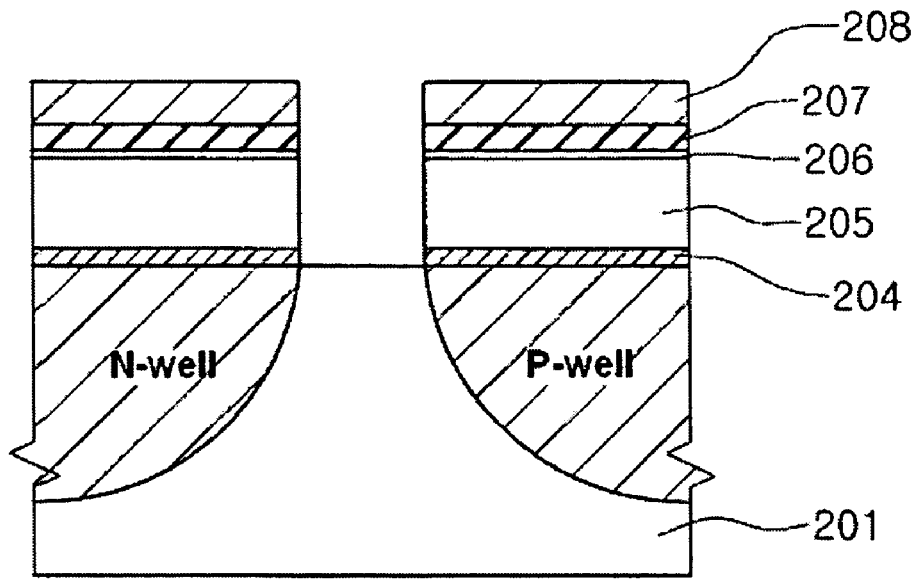

Referring to FIG. 2e, a mask pattern 208 is formed over the structure of FIG. 2d by a photolithography process. An etching process is performed using the mask pattern 208 as an etching mask until some portion(s) of the nitride layer 207, the oxide layer 206, the polysilicon layer 205, and the gate insulating layer 204 are removed to expose some portion(s) of the surface of the semiconductor substrate 201.

Figure 2F:
Figure 2F:
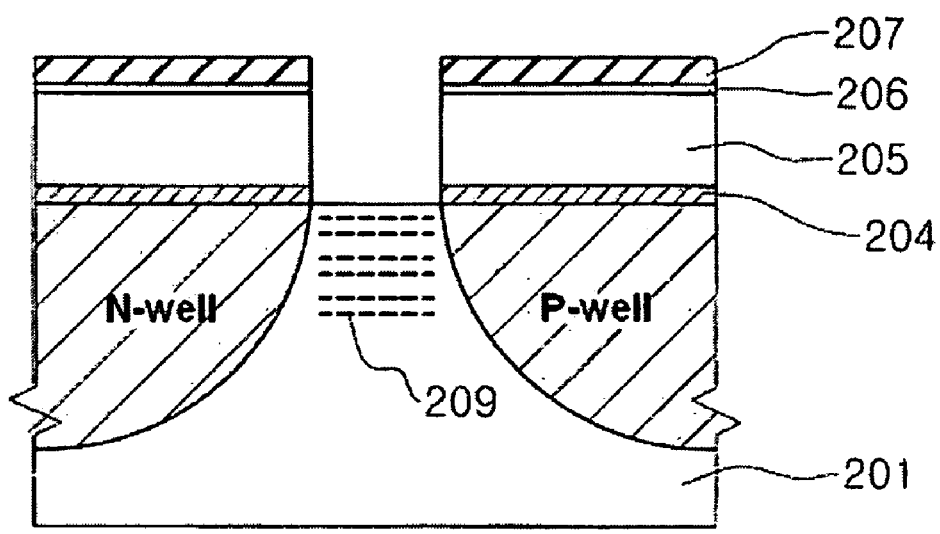

Referring to FIG. 2f, the mask pattern 208 is removed. Next, an ion implantation process is performed on the entire surface of the resulting structure to form an ion implant area 209 in the semiconductor substrate 201. The implanted ions are preferably oxygen ions. The ion implantation process is preferably performed two to five times using different energy levels. For example, in a threefold implantation, a first implantation is performed at an energy level between about 10 keV and about 50 keV, a second implantation is performed at an energy level between about 100 keV and about 150 keV and a third implantation is conducted at an energy level between about 200 keV and about 500 keV. The concentration of oxygen ion implanted is preferably about 1E17 to about 1E18 ions/cm$^2$ in each of the three implantation processes. As a result, an oxygen ion implant area 209 is formed in the semiconductor substrate 201. Implanting ions with different energy levels as described above produces an oxygen ion implant area 209 having a uniform oxygen concentration in the semiconductor substrate 201.

Figure 2G:
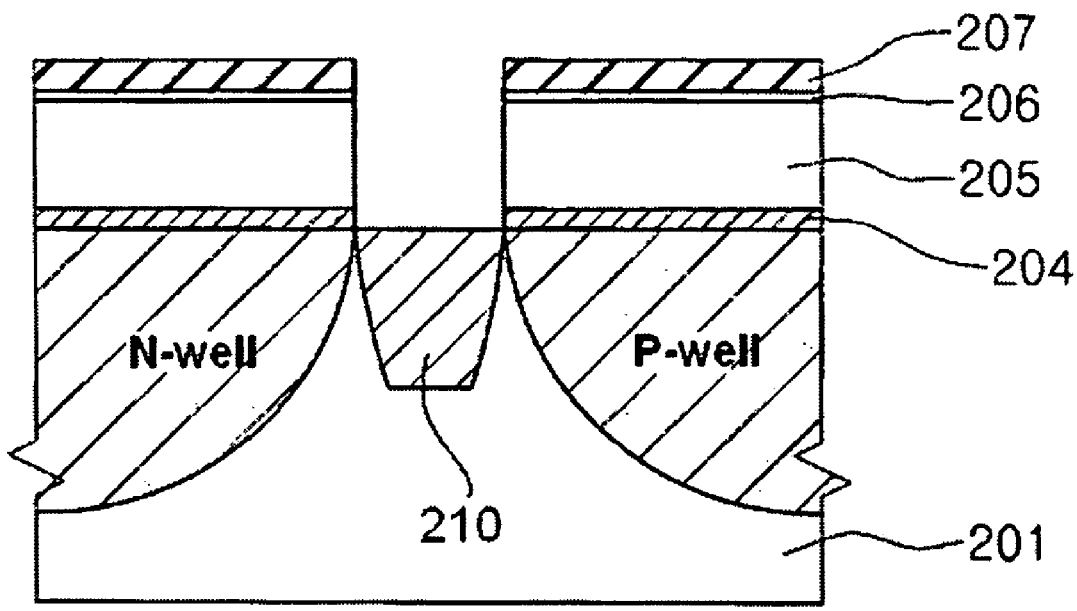

Referring to FIG. 2g, a heat treatment process is performed on the device of FIG. 2f to oxidize the ion implant area 209. The heat treatment is preferably a rapid heat treatment and is carried out for about 10 to about 20 seconds at a temperature between about 900° C. and about 1100° C. in a nitrogen atmosphere. As a result, a device isolation layer 210 is formed on the exposed area of the semiconductor substrate 201.

Figure 2H:
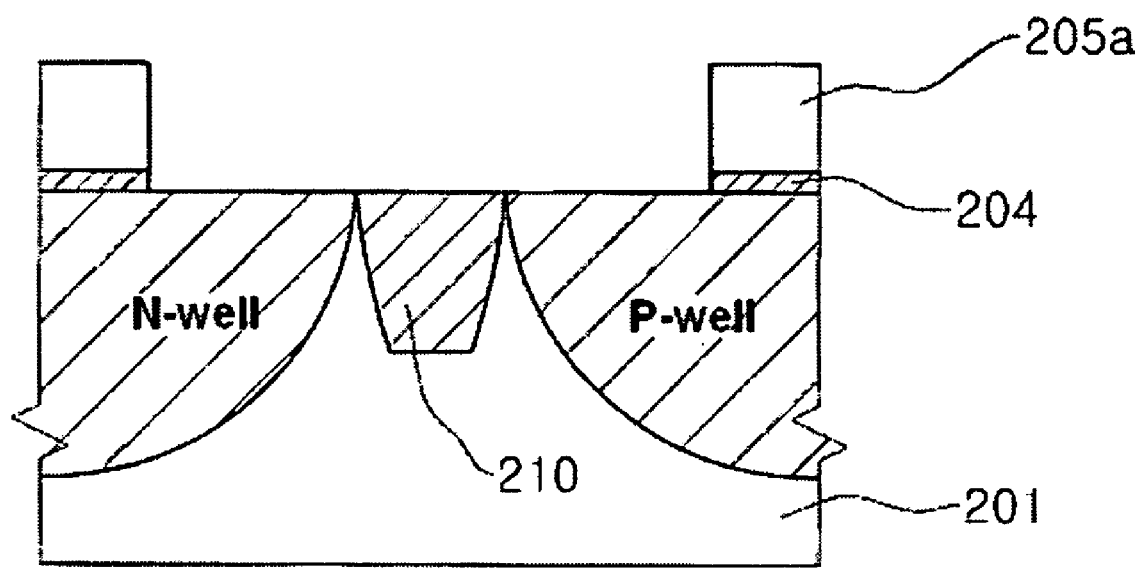

Referring to FIG. 2h, a mask pattern (not shown) is formed on the structure of FIG. 2g by a photolithography process. Using the mask pattern as an etching mask, some portion(s) of the nitride layer 207, the oxide layer 206, the polysilicon layer 205, and the gate insulating layer 204 are selectively removed to form one or more gate electrodes 205a.

Figure 2I:
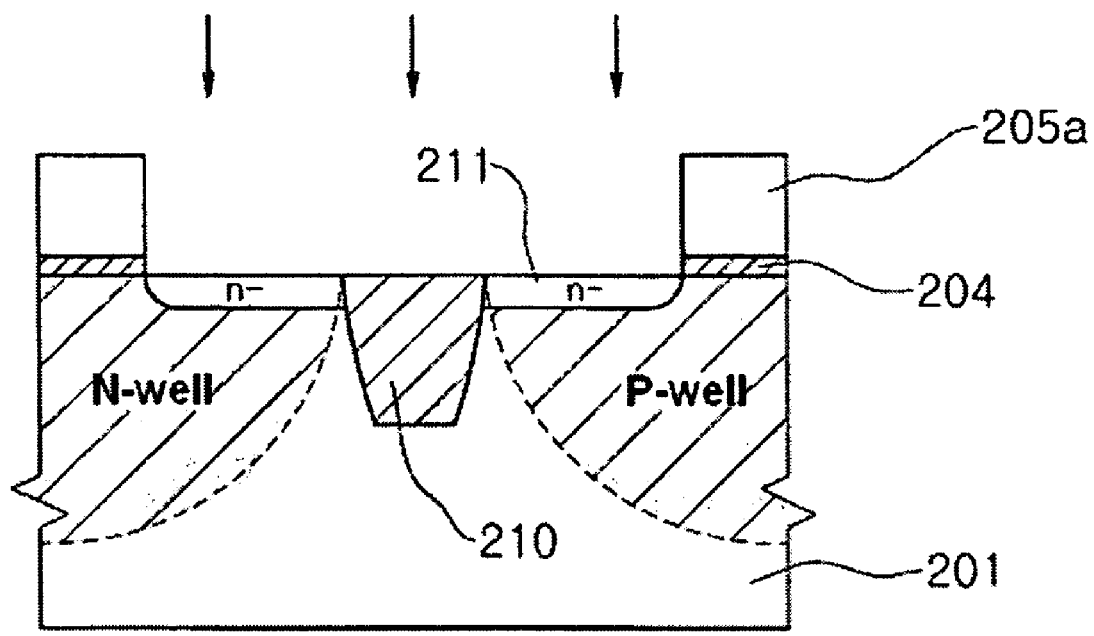

Referring FIG. 2i, an ion implantation process is performed to form a lightly doped drain (hereinafter referred to as "LDD") area. Because the semiconductor substrate 201 is divided into a p-type well area and an n-type well area, impurity ions implanted into each well area must have a different conduction type. Thus, when the LDD ion implantation is performed on the p-type well area, the n-type well area is covered with a proper mask. Boron (B) ions are then implanted at an energy level between about 5 keV and about 30 keV to form a low concentration ion implant layer 211 in the p-type well area. The boron ion implant concentration is preferably between about 1E13 ions/cm$^2$ and about 1E15 ions/cm$^2$. When the LDD ion implantation is performed on the n-type well area, the p-type well area is shielded with a proper mask. Arsenic (As) ions are then implanted at an energy level between about 10 keV and about 50 keV to form a low concentration ion implant layer 211 in the n-type well area. The Arsenic ion implant concentration is preferably between about 1E13 ions/cm$^2$ and about 1E15 ions/cm$^2$. In another example, instead of the arsenic ions, phosphorus ions may be implanted at an energy level between about 20 keV and about 100 keV. The phosphorus ion implant concentration is preferably between about 1E13 ions/cm$^2$ and about 1E15 ions/cm$^2$. Subsequently, a heat treatment process is performed on the resulting structure to activate the implanted ions. The heat treatment is preferably a rapid heat treatment and is carried out for about 10 to about 20 seconds at a temperature between about 900° C. and about 1050° C. in a nitrogen atmosphere.

Figure 2J:
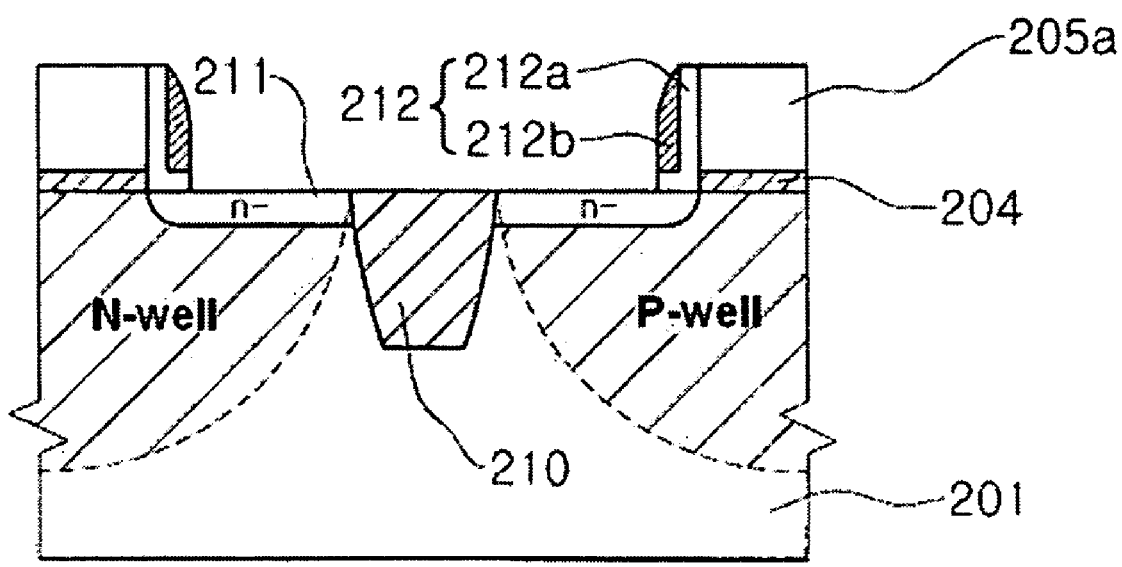

Referring to FIG. 2j, an insulating layer is formed over the entire semiconductor substrate including the gate electrode 205a. The insulating layer preferably consists of an oxide layer 212a and a nitride layer 212b. The oxide layer 212a preferably has a thickness between about 10 Å and about 100 Å. The nitride layer preferably has a thickness between about 100 Å and about 200 Å. The nitride layer 212b and the oxide layer 212a are etched by using dry etching, for example, reactive ion etching (RIE). As a result, spacers 212 are formed on the sidewalls of the gate electrode 205a.

Figure 2K:
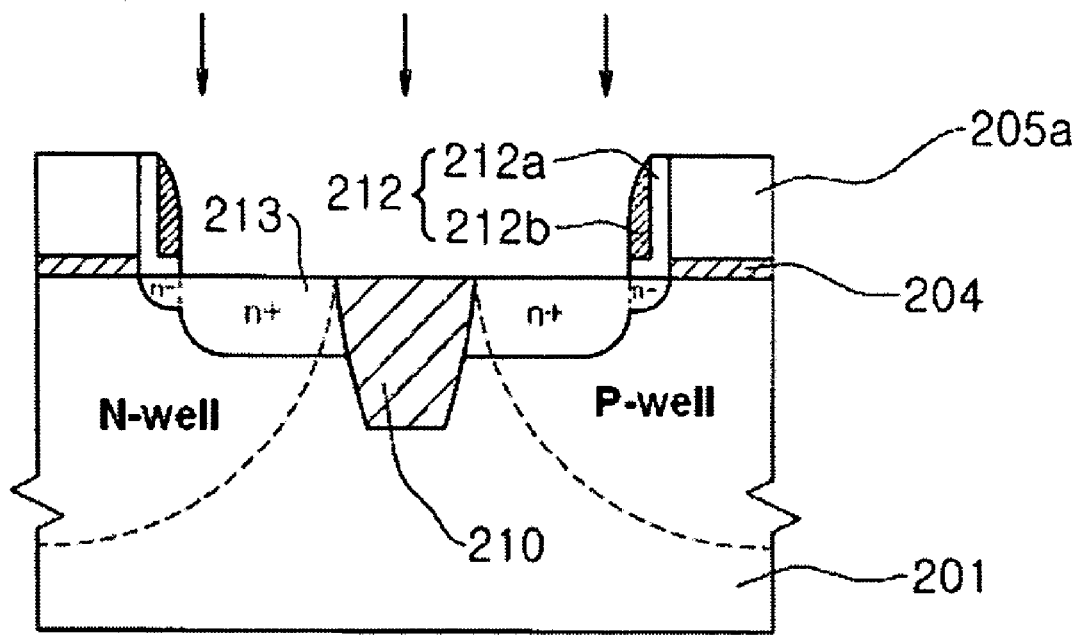

Referring to FIG. 2k, a source/drain formation process is performed. To implant impurity ions into the p-type well area, the n-type well area is shielded with a proper mask. Next, boron ions are implanted at an energy level between about 5 keV and about 20 keV with a concentration between about 1E15 ions/cm$^2$ and about 5E15 ions/cm$^2$ to form a high concentration ion implant layer 213 in the p-type well. To implant impurity ions into the n-type well area, the p-type well area is covered with a proper mask. Arsenic ions are then implanted at an energy level between about 10 keV and about 70 keV with a concentration between about 1E15 ions/cm$^2$ and about 5E15 ions/cm$^2$ to form a high concentration ion implant layer 213 in the n-type well. A heat treatment process is performed for the resulting structure to activate the implanted ions. The heat treatment is preferably a rapid thermal treatment which is carried out for about 10 to about 20 seconds at a temperature between about 900° C. and about 1050° C. in a nitrogen atmosphere.

Subsequently, later unit processes such as silicide formation are performed to complete a transistor.

Figure 3A:
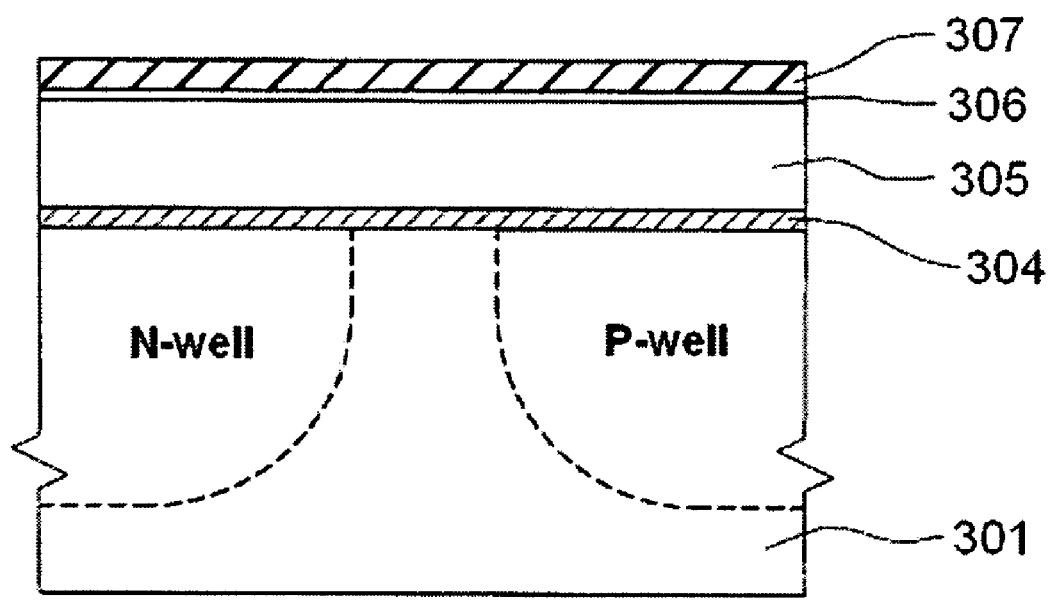
FIGS. 3a through 3h are cross-sectional views illustrating another example process of forming a device isolation structure of a semiconductor device performed in accordance with the teachings of the present invention.

FIGS. 3a through 3h are cross-section views illustrating another example process of forming a device isolation structure. Referring to FIG. 3a, an n-type well and a p-type well are formed in a semiconductor substrate 301 by using the same process as the first example. Next, a gate insulating layer 304, a layer to make a gate electrode (preferably, a polysilicon layer) 305, and a protective layer are sequentially formed on the semiconductor substrate 301. The gate insulating layer 304 has a thickness between about 20 Å and about 50 Å. The polysilicon layer 305 has a thickness between about 1500 Å and about 3000 Å. The protective layer preferably consists of an oxide layer 306 and a nitride layer 307. The oxide layer 306 has a thickness between about 30 Å and about 100 Å and the nitride layer 307 has a thickness between about 100 Å and about 500 Å.

Figure 3B:
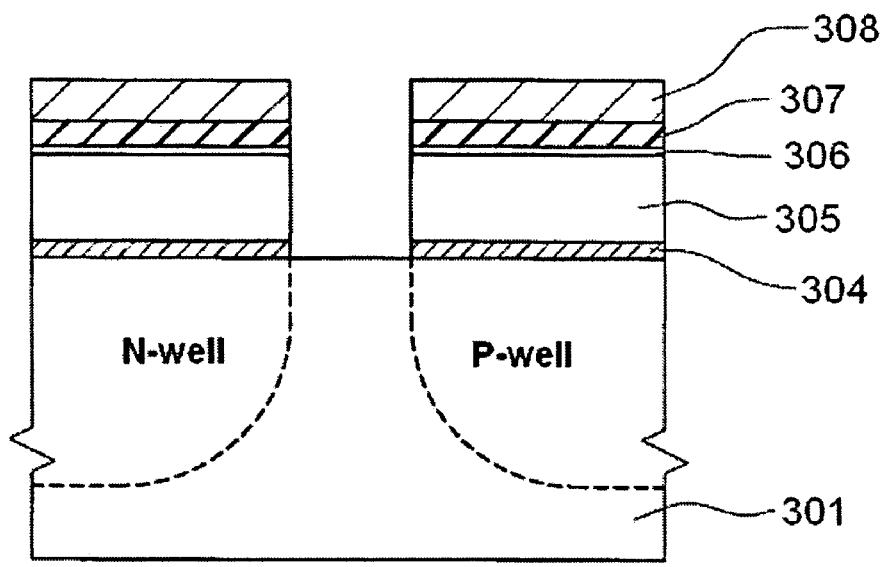

Referring to FIG. 3b, a mask pattern 308 is formed on the nitride layer 307 by using a photolithography process. An etching process is performed using the mask pattern 308 until some portion(s) of the nitride layer 307, the oxide layer 306, the polysilicon layer 305, and the gate insulating layer 304 are removed and some portion(s) of the surface of the semiconductor substrate 301 are exposed.

Figure 3C:
Figure 3C:
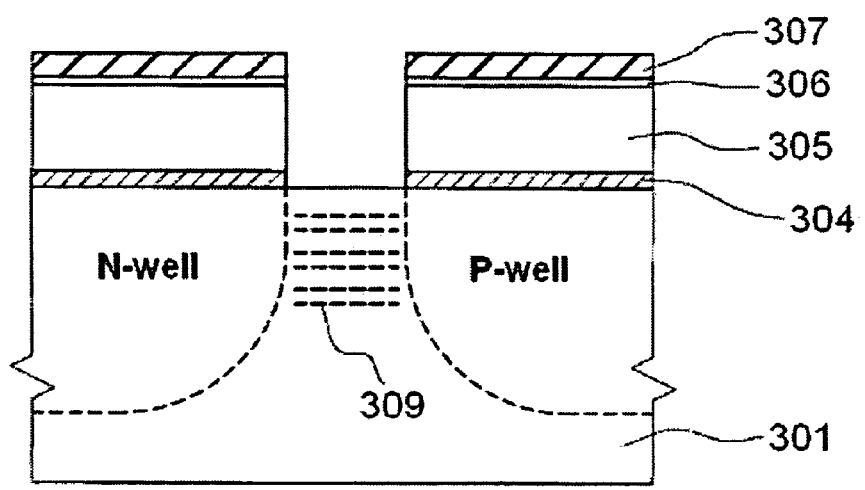

Referring to FIG. 3c, an ion implantation process is performed on the resulting structure. The implanted ions are preferably oxygen ions. The oxygen ions are implanted at an energy level between about 100 keV and about 150 keV with a concentration between about 1E17 ions/cm$^2$ and about 1E18 ions/cm$^2$. As a result, an oxygen ion implant area 309 is formed a predetermined distance under the surface of the semiconductor substrate 301.

Figure 3D:
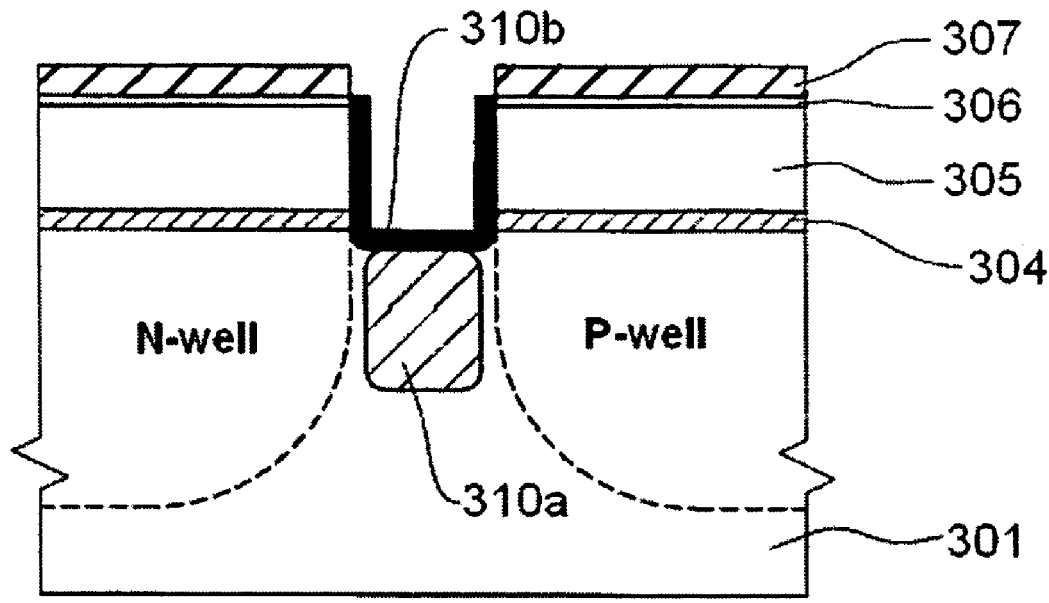

Referring to FIG. 3d, a first heat treatment process is performed on the resulting substrate to oxidize the oxygen ion implant area. The first heat treatment is preferably a rapid heat treatment and is carried out for about 10 to about 20 seconds at a temperature between about 900° C. and about 1100° C. in a nitrogen atmosphere. As a result, a device isolation layer 310a is created in the semiconductor substrate 301. Next, a second heat treatment process is performed on the resulting structure to form a device isolation oxide layer 310b on the surface of the device isolation layer 310a. The device isolation oxide layer 310b is also formed on the sidewalls of the polysilicon layer 305 by the second heat treatment.

As described in the above oxygen ion implantation process, the oxygen ion implant area is formed a predetermined distance under the surface of the semiconductor substrate 301. Therefore, the implanted oxygen ion concentration is relatively low near the surface of the semiconductor substrate 301. Thus, the device isolation layer 310a, (which is formed by the first heat treatment), may not completely insulate between the n-type well and the p-type well. However, by forming the device isolation oxide layer 310b on the device isolation layer 310a through the second heat treatment, this disclosed method can improve the device isolation characteristic.

Figure 3E:
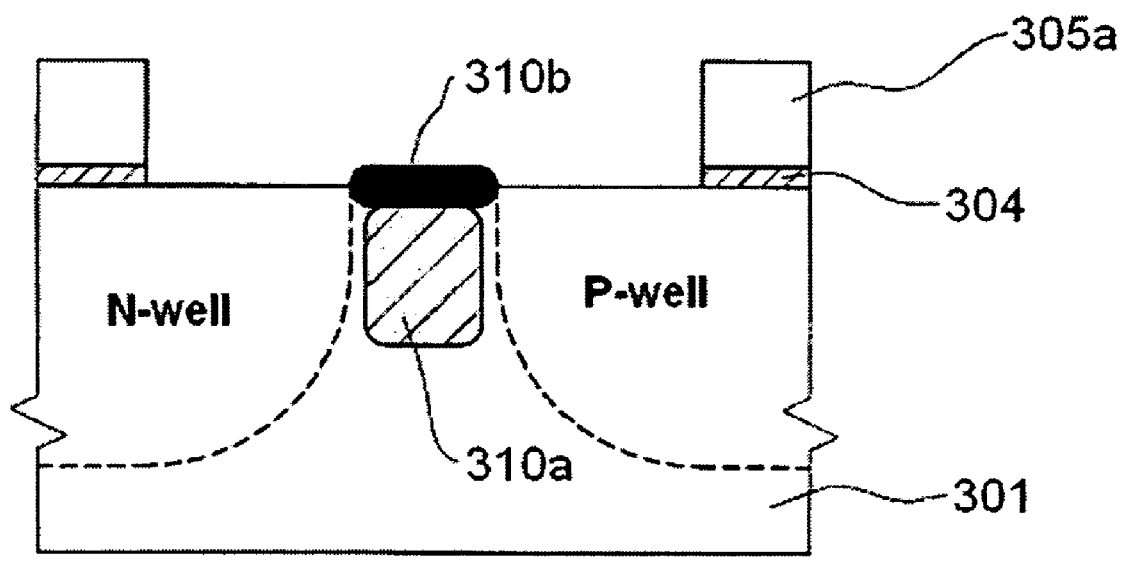

Referring to FIG. 3e, a mask pattern (not shown) is formed on the nitride layer 307 through a photolithography process. Using the mask pattern as an etching mask, some portion(s) of the nitride layer 307, the oxide layer 306, the polysilicon layer 305, and the gate insulating layer 304 are selectively etched to form a gate electrode 305a.

Figure 3F:
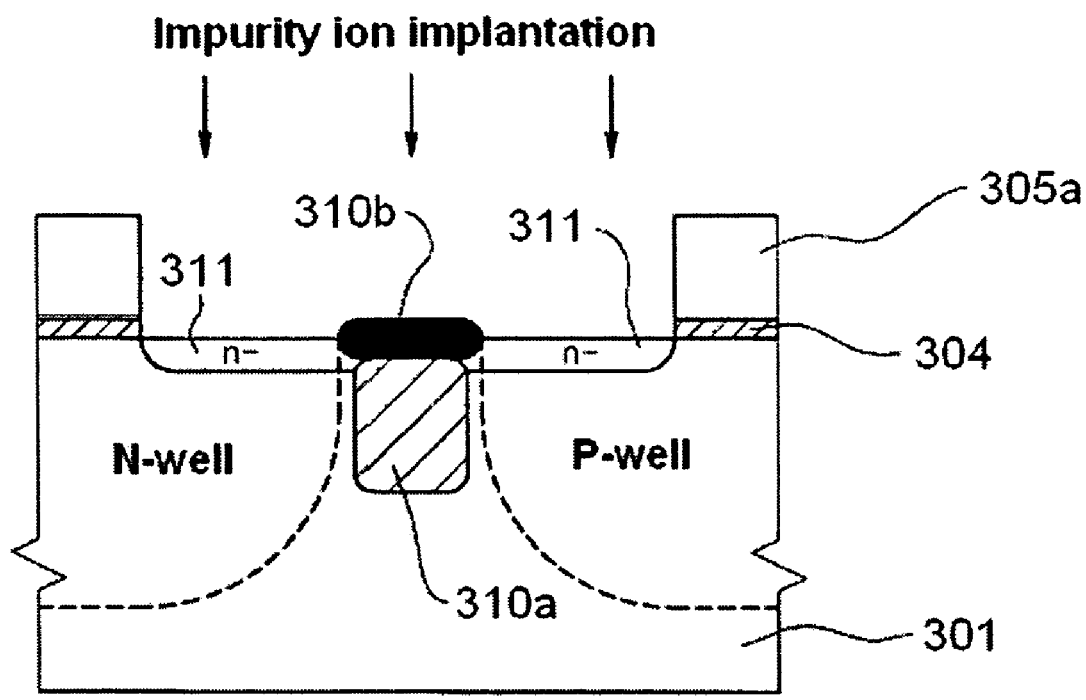

Referring to FIG. 3f, an LDD ion implantation process is performed. First, the n-type well area is covered with a proper mask. Boron ions are then implanted into the semiconductor substrate at an energy level between about 5 keV and about 30 keV with a concentration between about 1E13 ions/cm$^2$ and about 1E15 ions/cm$^2$ to form a low concentration ion implant layer 311 in the p-type well area. Next, the p-type well area is covered with a proper mask. Arsenic ions are then implanted into the semiconductor substrate at an energy level between about 10 keV and about 50 keV with a concentration between about 1E13 ions/cm$^2$ and about 1E15 ions/cm$^2$ to form a low concentration ion implant layer 311 in the n-type well area. Instead of the arsenic ions, phosphorus ions may be implanted at an energy level between about 20 keV and about 100 keV with a concentration between about 1E13 ions/cm$^2$ and about 1E15 ions/cm$^2$. Next, a heat treatment process is performed on the resulting structure to activate the implanted ions. The heat treatment is preferably a rapid heat treatment and is carried out for about 10 to about 20 seconds at a temperature between about 900° C. and about 1050° C. in a nitrogen atmosphere.

Figure 3G:
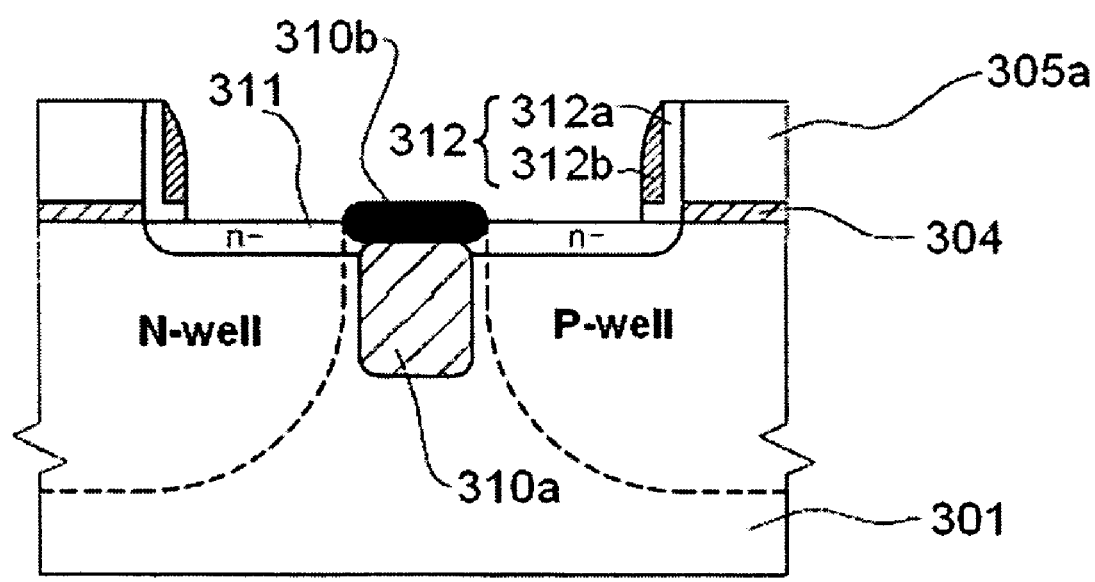

Referring to FIG. 3g, an oxide layer 312a and a nitride layer 312b are formed over the resulting substrate. The oxide layer 312a and the nitride layer 312b are then etched through the same process as explained above in connection with the first example to form spacers 312 consisting of the oxide layer 312a and the nitride layer 312b on the sidewalls of the gate electrode 305a.

Figure 3H:
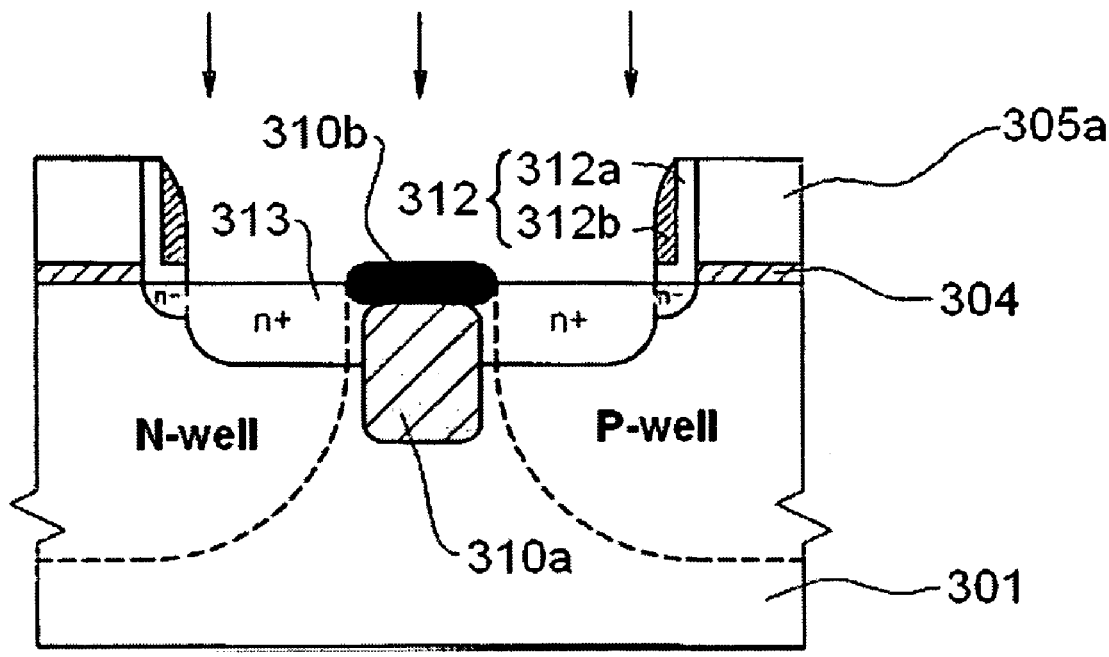

Referring to FIG. 3h, a source/drain region 313 is formed by implanting high concentration impurity ions into the semiconductor substrate 301 and heat-treating the resulting substrate. The source/drain formation method is the same as the source/drain formation method described above in the first example.

Subsequently, later unit processes such as silicide formation are performed to complete a transistor.

Figure 4A:
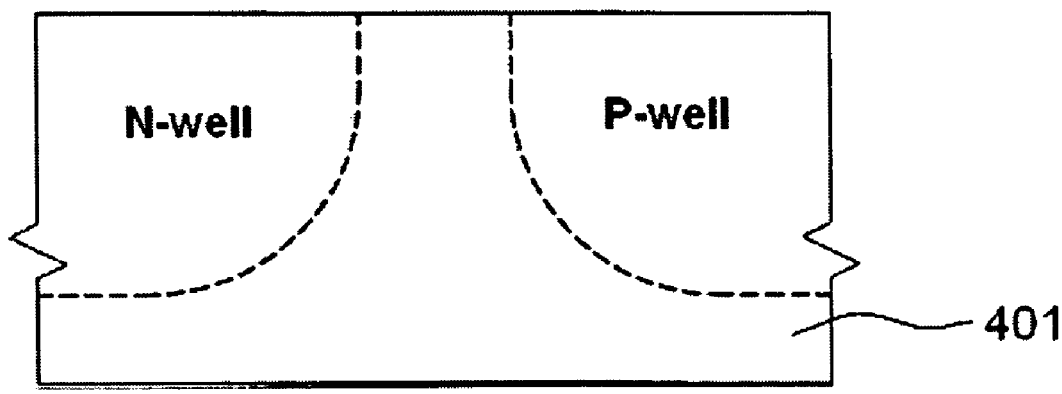
FIGS. 4a through 4f are cross-sectional views illustrating another example process of forming a device isolation structure of a semiconductor device performed in accordance with the teachings of the present invention.

FIGS. 4a through 4f are cross-sectional views illustrating another example method of forming a device isolation structure. Referring to FIG. 4a, a p-type well and an n-type well are formed in the semiconductor substrate 401 by using the same process as described above in the first example.

Figure 4B:
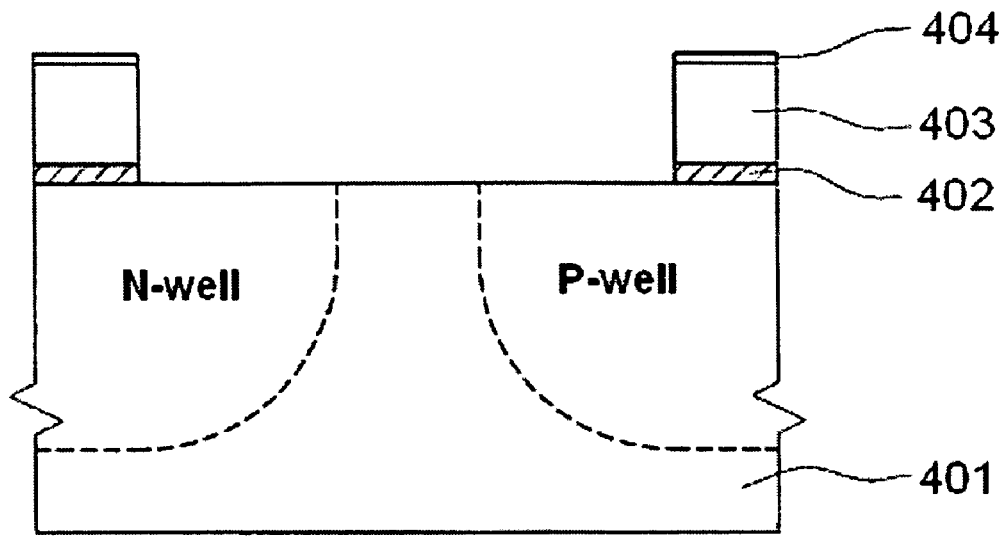

Referring to FIG. 4b, a gate insulating layer 402, a polysilicon layer, and a protective layer 404 are sequentially formed on the semiconductor substrate 401. The protective layer 404 preferably comprises an oxide layer having a thickness between about 30 Å and about 100 Å. Using photolithography and etching processes, some portion(s) of the gate insulating layer 402, the polysilicon layer, and the protective layer 404 are removed by to form a gate electrode 403.

Figure 4C:
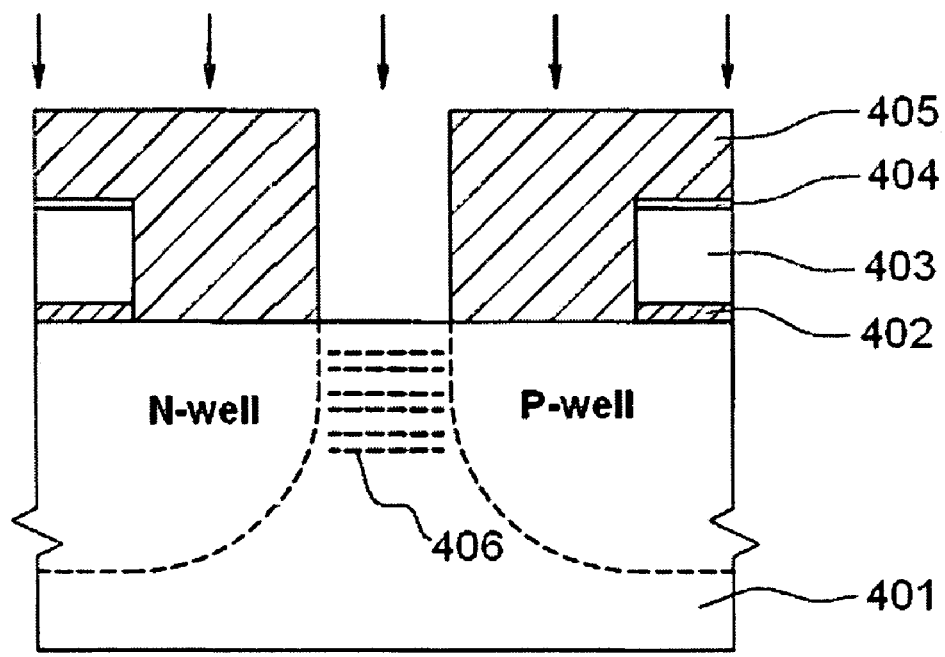

Referring to FIG. 4c, a photoresist layer is deposited over the entire semiconductor substrate including the protective layer 404. Some portion(s) of the photoresist layer is selectively removed to form an ion implantation mask 405. The ion implantation mask 405 exposes an area of the surface of the semiconductor substrate on which a device isolation layer will be formed. Then, an ion implantation process is performed using the ion implantation mask 405 to form an ion implant area 406 in the semiconductor substrate 401. The implanted ions are preferably oxygen ions. The ion implantation process is carried out under the same conditions as described above in the second example.

Figure 4D:
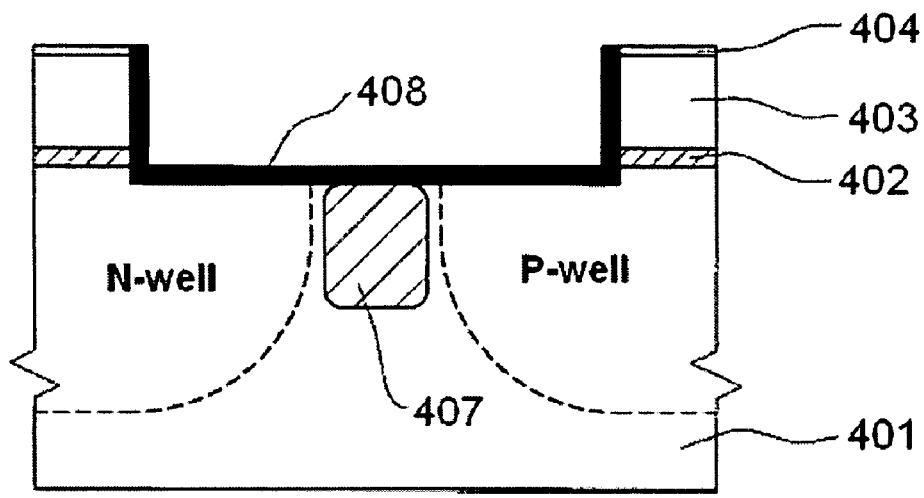

Referring to FIG. 4d, the ion implantation mask 405 is removed. A first heat treatment process is then performed on the resulting substrate to oxidize the ion implant area 406 to form a device isolation layer 407. The first heat treatment is preferably a rapid heat treatment that is performed for about 10 to about 20 seconds at a temperature between about 900° C. and about 1100° C. in a nitrogen atmosphere.

Next, a second heat treatment process is performed on the resulting structure to form a device isolation oxide layer 408 on the exposed surface of the semiconductor substrate 401 including the device isolation layer 407. The device isolation oxide layer 408 may be formed on the sidewalls of the gate electrode 403 because the gate electrode 403 is made of polysilicon. As described in the second example, the device isolation oxide layer 408 can improve the insulation characteristic of the semiconductor substrate 401.

Figure 4E:
Figure 4E:
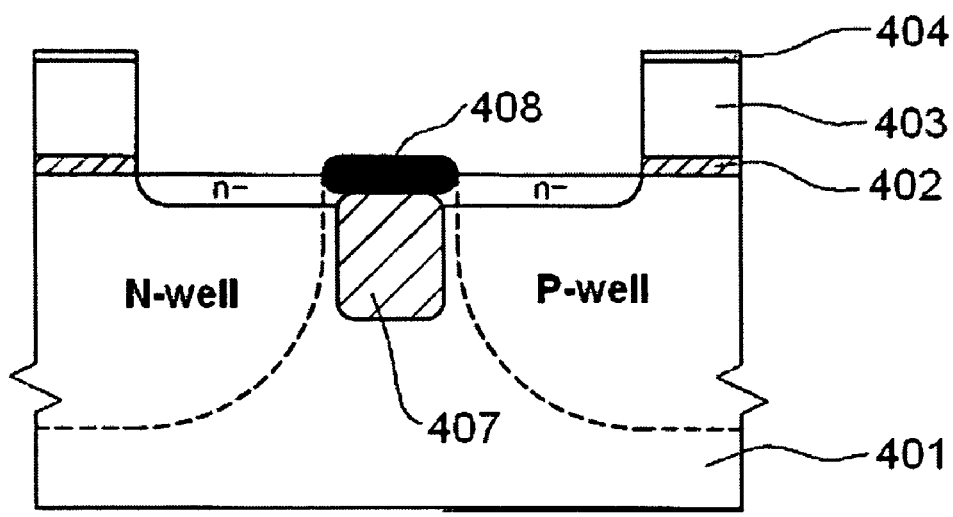

Referring to FIG. 4e, the portion(s) of the device isolation oxide layer 408 which are not on the device isolation layer 407 are removed. An LDD ion implantation process is then performed on the entire surface of the resulting structure. The LDD ion implantation process is performed under the same conditions as were described above in the second example.

Figure 4F:
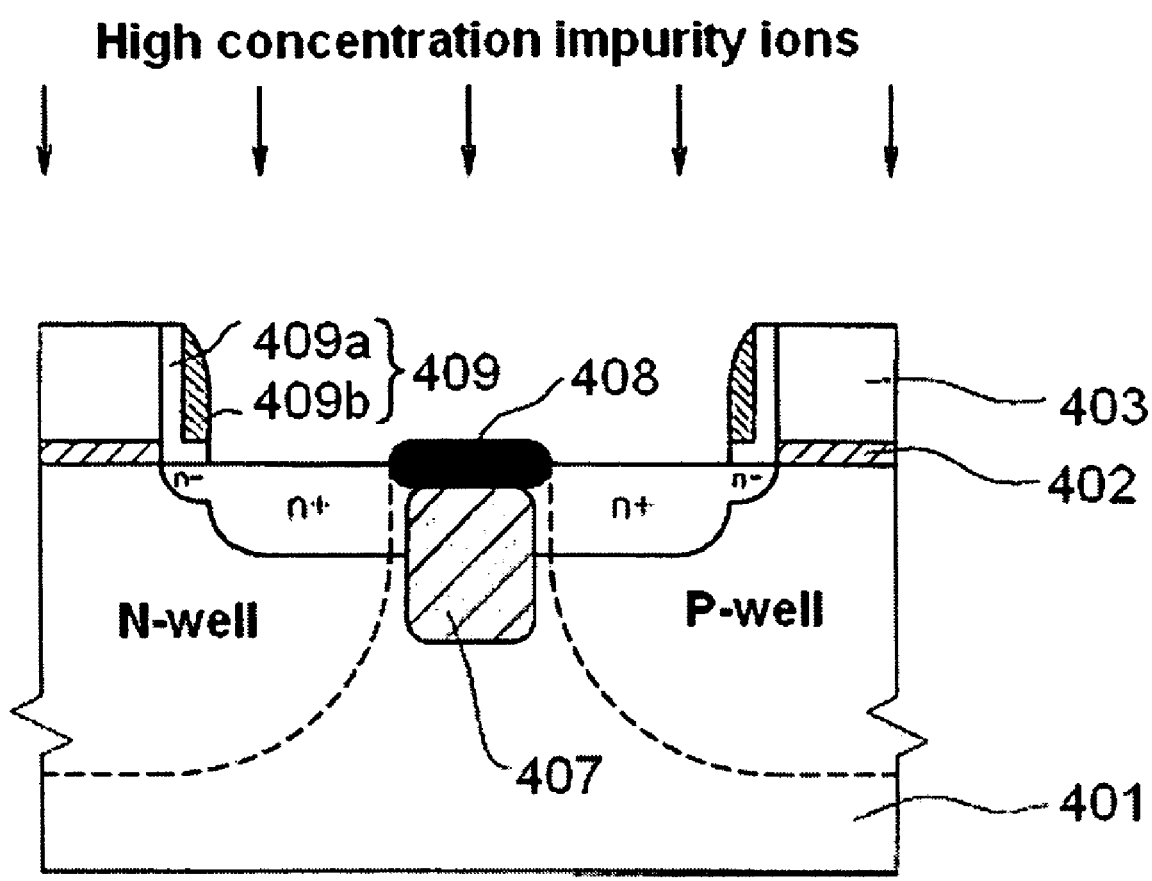

Referring to FIG. 4f, spacers 409 consisting of an oxide layer 409a and a nitride layer 409b are formed on the sidewalls of the gate electrode 403. Then, a source/drain region is formed in the semiconductor substrate 401 by using ion implantation and heat treatment processes.

From the foregoing, persons of ordinary skill in the art will appreciate that the above-described methods of forming a device isolation structure can simplify the manufacturing process and enhance productivity by forming wells, depositing a gate insulating layer and a polysilicon layer, exposing some portion of the semiconductor substrate by selectively removing some portion of the gate insulating layer and the polysilicon layer, and forming a device isolation layer on the exposed area of the semiconductor substrate.

It is noted that this patent claims priority from Korean Patent Application Serial Number 10-2003-0065626, which was filed on Sep. 22, 2003, and from Korean Patent Application Serial Number 10-2003-0072111, which was filed on Oct. 16, 2003, both of which are hereby incorporated by reference in their entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of fabricating a semiconductor device comprising:

forming a p-type well and an n-type well in a semiconductor substrate;

sequentially depositing a gate insulating layer and a gate electrode material layer;

depositing a protective layer on the gate electrode material layer;

removing a portion of the gate insulating layer, the gate electrode material layer, and the protective layer to form a gate electrode;

forming an ion implantation mask on the protective layer to expose a surface area of the semiconductor substrate;

implanting ions into the exposed surface area of the semiconductor substrate using the ion implantation mask;

performing a first heat treatment process to form a device isolation layer;

performing a second heat treatment process to form a device isolation oxide layer on the device isolation layer;

forming an LDD region by implanting low concentration impurity ions into the semiconductor substrate;

forming a spacer on a sidewall of the gate electrode; and implanting high concentration impurity ions into the semiconductor substrate to form a source/drain region in the semiconductor substrate.

2. A method as defined by claim 1, wherein the protective layer comprises an oxide layer.

3. A method as defined by claim 2, wherein the oxide layer has a thickness between about 30 Å and about 100 Å.

4. A method as defined by claim 1, wherein implanting ions into the semiconductor substrate using the ion implantation mask comprises implanting oxygen ions.

5. A method as defined by claim 1, wherein implanting ions into the semiconductor substrate using the ion implantation mask is performed at an energy level between about 100 keV and about 150 keV with an ion concentration between about 1E17 ions/cm$^2$ and about 1E18 ions/cm$^2$.

6. A method as defined by claim 1, wherein the first heat treatment process is performed for about 10 to about 20 seconds at a temperature between about 900 Å and about 1100 Å in a nitrogen atmosphere.

7. A method as defined by claim 1, wherein the device isolation oxide layer formed by the second heat treatment process has a thickness between about 50 Å and about 200 Å.

8. A method as defined by claim 1, wherein the gate electrode material layer comprises polysilicon and has a thickness between about 1500 Å and about 3000 Å.

* * * * *